(12) United States Patent
Goodman et al.

(10) Patent No.: US 6,189,601 B1
(45) Date of Patent: Feb. 20, 2001

(54) HEAT SINK WITH A HEAT PIPE FOR SPREADING OF HEAT

(75) Inventors: Lloyd Jack Goodman, Gilbert; Chai-Pin Chiu, Chandler; Abhay W. Watwe, Chander; Ram Viswanath, Phoenix, all of AZ (US)

(73) Assignee: Intel Corporation, Santa Clara, CA (US)

( * ) Notice: Under 35 U.S.C. 154(b), the term of this patent shall be extended for 0 days.

(21) Appl. No.: 09/305,847

(22) Filed: May 5, 1999

(51) Int. Cl.[7] ............................. F18F 7/00; F28D 15/00; H05K 7/20
(52) U.S. Cl. ..................... 165/80.3; 165/104.33; 361/700
(58) Field of Search ............................. 165/80.3, 104.33, 165/185; 361/700; 257/715; 174/15.2

(56) References Cited

U.S. PATENT DOCUMENTS

| | | | |
|---|---|---|---|
| 5,381,859 | * 1/1995 | Minakami et al. | 165/80.3 |
| 5,508,908 | * 4/1996 | Kazama et al. | 165/80.3 |
| 5,699,853 | * 12/1997 | Goth et al. | 165/104.33 |
| 5,760,333 | * 6/1998 | Kitashara et al. | 165/80.3 |
| 5,964,279 | * 3/2000 | Mochizuki et al. | 165/80.3 |
| 6,041,850 | * 3/2000 | Esser et al. | 165/104.33 |

OTHER PUBLICATIONS

Thermacore Inc. Brochure, Thermal Cooling Solution For Power Semiconductors, pp. 2–6, Apr. 1998.*

* cited by examiner

*Primary Examiner*—Ira S. Lazarus
*Assistant Examiner*—Tho Duong
(74) *Attorney, Agent, or Firm*—Blakely, Sokoloff, Taylor & Zafman LLP

(57) ABSTRACT

The invention provides a heat sink for cooling and electronic device. The heat sink includes a member, and a heat pipe secured to the member. The member has a first portion, a second portion, and a plurality of fins on the second portion. The heat pipe has a first, evaporator section and a second, condenser section. The first section is located at the first portion so that heat can be transferred thereto from a heat generating component of the electronic device. The second section is located at the second portion so that heat can be transferred therefrom to the second portion.

17 Claims, 9 Drawing Sheets

HEAT SINK WITH A HEAT PIPE FOR SPREADING OF HEAT

BACKGROUND OF THE INVENTION

1). Field of the Invention

This invention relates to a heat sink for cooling an electronic device which may include a substrate such as a printed circuit board, and a heat generating component such as a semiconductor package mounted to the substrate. More particularly, this invention relates to such a heat sink which is mounted over such a heat generating component.

2). Discussion of Related Art

An electronic device which is located within a computer may, for example, include a printed circuit board and a semiconductor package mounted to the printed circuit board. The semiconductor package may include a semidconductor die. The semiconductor die may, for example be a processor which generates a substantial amount of heat when operated. Various systems may be used for cooling such a semiconductor package.

For example, a heat sink may be mounted over the semiconductor package. The typical heat sink includes a thermally conductive plate located at the semiconductor package, and a plurality of fins located on the thermally conductive plate on a side thereof opposing the semiconductor package. For optimum heat transfer characteristics of such a heat sink, the fins are usually located as dose as possible to the semiconductor package. The overall volume in which the fins can be located is thereby limited which, in turn, limits the number of fins that can be used and therefore the amount of heat that can be transferred.

SUMMARY OF THE INVENTION

The invention provides a heat sink for cooling and electronic device. The heat sink includes a member, and a heat pipe secured to the member. The member has a first portion, a second portion, and a plurality of fins on the second portion. The heat pipe has a first, evaporator section and a second, condenser section. The first section is located at the first portion so that heat can be transferred thereto from a heat generating component of the electronic device. The second section is located at the second portion so that heat can be transferred therefrom to the second portion.

BRIEF DESCRIPTION OF THE DRAWINGS

The invention is further described by way of examples with reference to the accompanying drawings wherein.

DETAILED DESCRIPTION OF THE INVENTION

Figure 1:
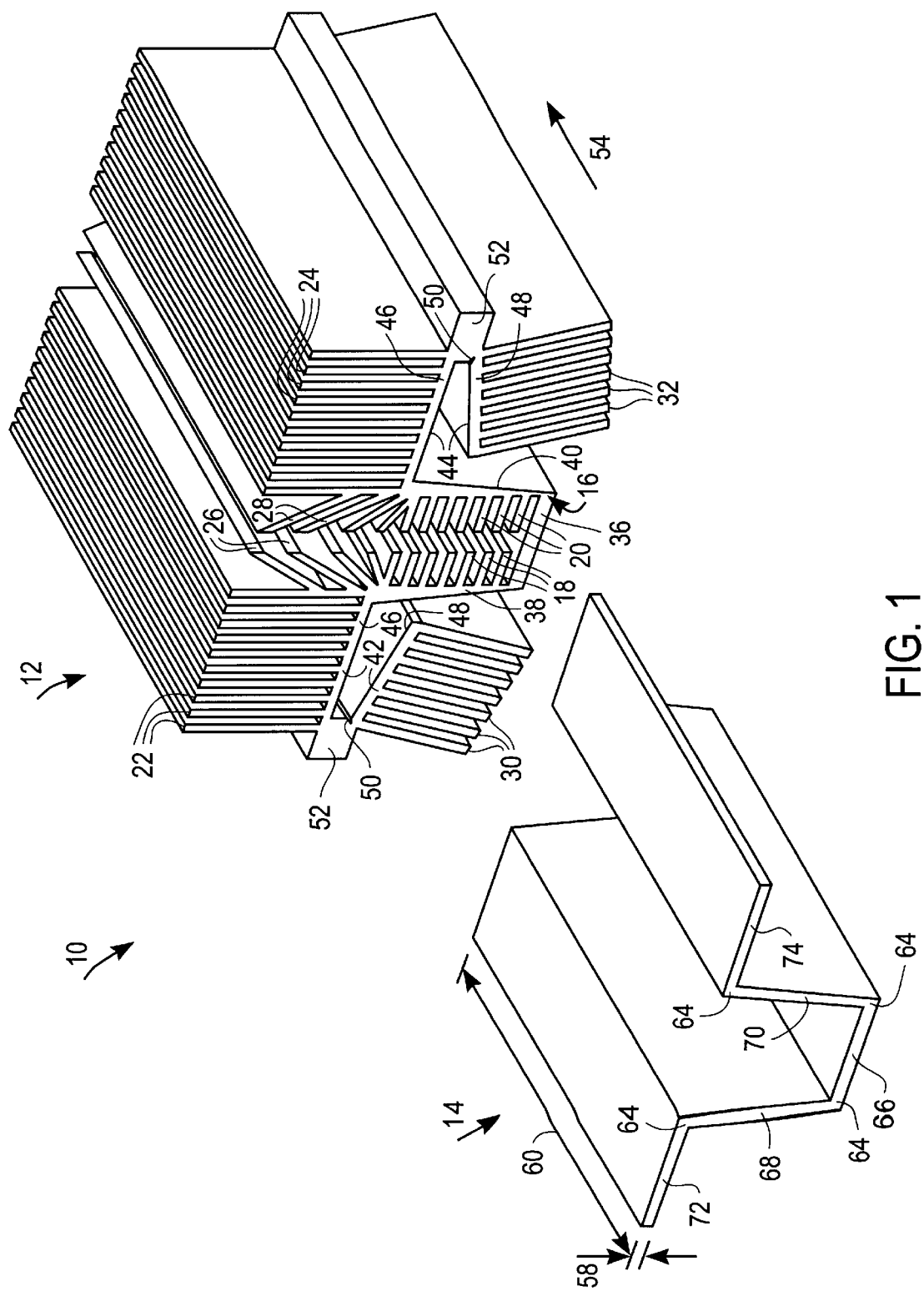
FIG. 1 is a perspective view of a heat sink, according to one embodiment of the invention, which includes a finned member and a flat heat pipe before final assembly.

FIG. 1 of the accompanying drawings illustrates a heat sink 10 according to an embodiment of the invention. The heat sink 10 is shown before final assembly and includes a finned member 12 and a flat heat pipe 14.

The member 12 includes a thermally conductive heat plate 16, and respective sets of fins 18, 20, 22, 24, 26, 28, 30, and 32 extending from the heat plate 16. The member 12 is typically made of a metal such as aluminum and is typically formed in an extrusion process.

Each fin has a length and a width, wherein the length is less than fifteen times the width, or has an aspect ratio of less than fifteen. Extrusion of aluminum fins is relatively difficult when compared to extrusion of fins made of other materials such as copper. By forming the fins so that they have aspect ratios of less than fifteen to one and spaces between them having aspect ratios of less than five to one, the member 12 can more easily be extruded, even if made of aluminum. Because the fins are shorter, however, more fins have to be provided to ensure suitable cooling rates. All the fins cannot be located within a vicinity of a heat generating component of an electronic device. For that reason, the heat pipe 14 is used for spreading heat from the vicinity of such a component to fins that are located distant from such a component.

The heat plate 16 firstly includes a portion 36 located in a lower horizontal plane. Another portion 38 of the heat plate 16 extends vertically upwardly from an edge of the lower horizontal portion 36, and a further portion 40 extends vertically upwardly from an opposing edge of the lower horizontal portion 36. Yet a further portion 42 of the heat plate 16 extends from an upper edge of the vertical portion 38 in a direction away from the lower horizontal portion 36. A portion 44 of the heat plate 16 also extends from an upper edge of the vertical portion 40 away from the lower horizontal portion 36.

The portions 42 and 44 are splayed longitudinally so that each portion 42 and 44 includes an upper half 46 and a lower half 48. An outer edge of each lower half 48 is joined to an outer edge of a respective upper half 46 by a hinge 50. The hinge 50 is a reduction in width between the upper and lower halves 46 and 48 so that a stress concentration is formed in the hinge 50 when the lower half 48 is pivoted relative to the upper half 46. The heat plate 16 extends past the hinges 50 and terminates in retaining formations 52.

The fins 18 are located on the vertical portion 38 and extend horizontally from the vertical portion 38 towards the vertical portion 40. The fins 20 are located on the vertical portion 40 and extend horizontally from the vertical portion 40 towards the vertical portion 38. Each one of the fins 18 and 20 has an aspect ratio of about seven to one.

The fins 22 are located on the upper half 46 of the portion 42 and extend vertically upwardly therefrom. The fins 24 are located on the upper half 46 of the portion 44 and extend vertically upwardly therefrom. Each one of the fins 22 and 24 has an aspect ratio of about ten to one.

The fins 26 are located on an inner surface of one of the fins 22 located closest to the fins 24. The fins 28 are located on an inner surface of one of the fins 24 located closest to the fins 22. The fins 26 and 28 diverge away from one another towards tips thereof, thus making them easier to manufacture in an extrusion process. Some of the fins 26 and 28 have aspect ratios of about seven, and others have aspect ratios of about three, four, five, six, seven or eight to one.

The fins 30 are located on the lower half 48 of the portion 42 and extend substantially at right angles from a plane in which the lower half 48 of the portion 42 is located. The fins 32 are located on the lower half 48 of the portion 44 and extend substantially at right angles from a plane in which the lower half 48 of the portion 44 is located. Each one of the fins 30 and 32 has an aspect ratio of about ten to one.

Because the member 12 is made in an extrusion process, all the components of the member 12 extend parallel to one another in an extrusion or a direction 54, and their orientations relative to one another are defined in an x-y plane, at right angles to the z-direction, only.

The heat pipe 14 has a thickness 58 and a length defined in an x-y plane, and a width 60 in the z-direction 54. The length of the heat pipe changes direction at a number of locations 64. The heat pipe 14 thereby, firstly, has a central, horizontal, evaporator section 66 located in a horizontal plane. A condenser section 68 of the heat pipe 14 extends vertically upwardly from one end of the horizontal section 66 and another condenser section 70 of the heat pipe 14 extends vertically upwardly from an opposing end of the horizontal section 66. Yet a further condenser section 72 of the heat pipe 14 extends horizontally from an upper end of the vertical section 68 in a direction away from the horizontal section 66. A condenser section 74 of the heat pipe 14 also extends from an upper end of the vertical section 70 in a direction horizontally away from the horizontal section 66.

Figure 2:
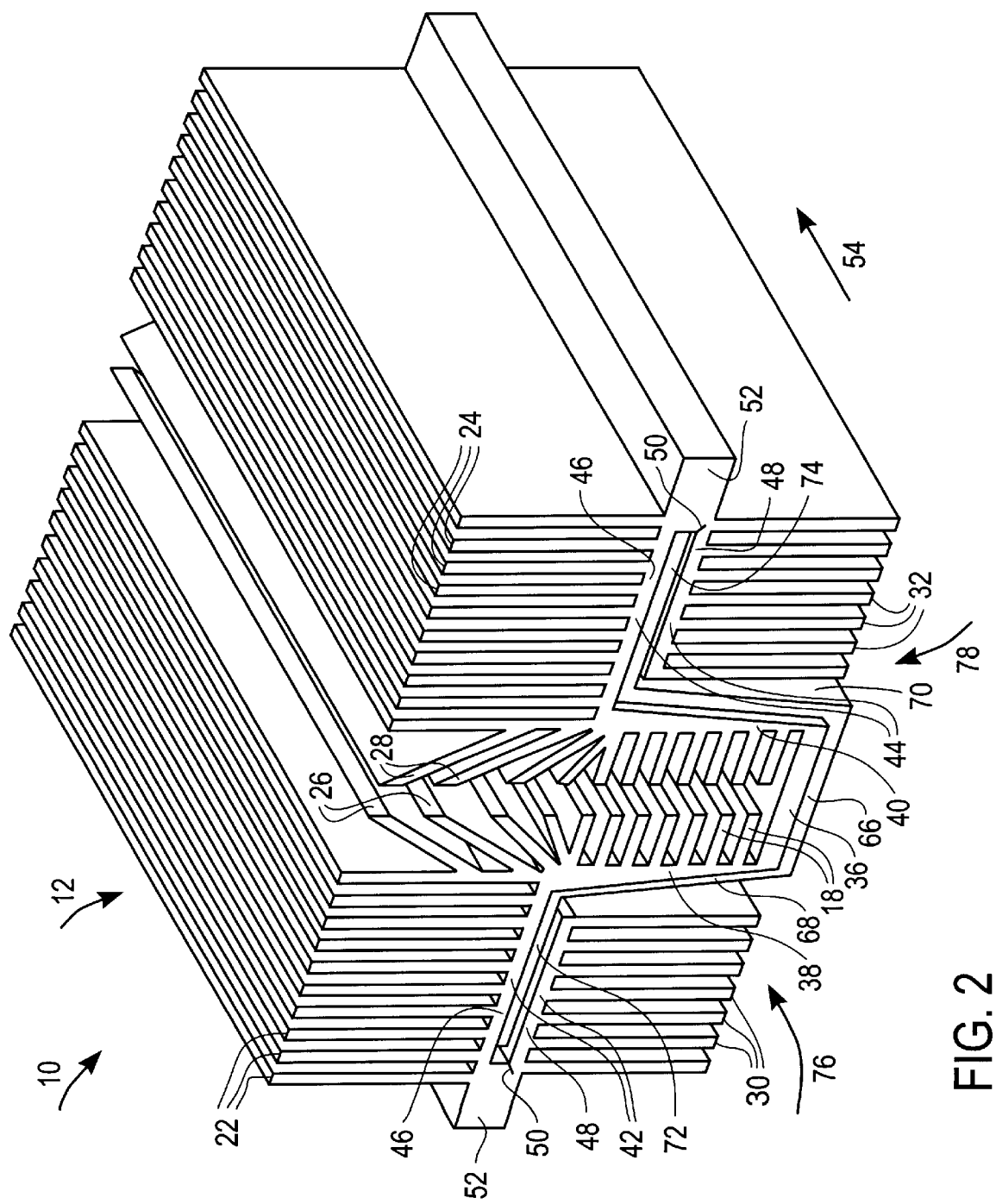
FIG. 2 is a perspective view similar to FIG. 1 after the heat pipe is secured to the member.

As illustrated in FIG. 2, the heat pipe 14 is inserted into the member 12 in the z-direction 54. The heat pipe 14 has a width in the z-direction which more or less corresponds with a width of the member 12 in the z-direction. The horizontal section 66 is located at the lower horizontal portion 36. A lower surface of the horizontal section 66 is exposed, and an upper surface of the horizontal section 66 is located against a lower surface of the lower horizontal portion 36.

The vertical sections 68 and 70 are located at the vertical portions 38 and 40 respectively. Inner surfaces of the vertical sections 68 and 70 are located against the vertical portions 38 and 40.

The section 72 is located between the upper half 46 and the lower half 48 within the portion 42. The section 74 is located between the upper half 46 and the lower half 48 within the portion 44.

Referring firstly to the portion 42, the lower half 48 is then pivoted on the hinge 50 towards the upper half 46 in a direction 76 so that the section 72 is squeezed between the upper half 46 and the lower half 48. An interface between the section 72 and the upper half 46 is preferably at least a transition fit or, more preferably, an interference fit. An interface between the section 72 and the lower half 48 is also preferably at least a transition fit or, more preferably an interference fit.

Referring now to the portion 44, the lower half 48 is pivoted on the hinge 50 relative to the upper half 46 in a direction 78 so that the section 74 is squeezed between the upper half 46 and the lower half 48. An interface between the section 74 and the upper half 46 is preferably at least a transition fit or, more preferably, an interference fit and an interface between the section 74 and the lower half 48 is preferably also at least a transition fit or, more preferably, an interference fit.

The heat pipe 14 is thus secured to the member 12. Once the lower halves 48 are pivoted relative to the upper halves 46, it can be seen that the portions 42 and 44 are located in substantially the same upper horizontal plane which is higher than and substantially parallel to the lower horizontal plane in which the lower horizontal portion 36 is located. By spacing the plane of the upper horizontal portions 42 and 44 from the plane of the lower horizontal portion 36, space is provided for locating the fins 30 and 32 on lower sides of the upper horizontal portions 42 and 44 respectively. Two sets of fins 22 and 30 can thus be located on the upper horizontal portion 42, on opposing sides of the upper horizontal portion 42, and two sets of fins 24 and 32 can be located on the upper horizontal portion 44, on opposing sides of the upper horizontal portion 44. In addition, a space above the lower horizontal portion 36 is also provided with fins 18, 20, 26, and 28. The member 12 thus has a relatively small rectangular shape in an x-y plane that has a total of fifty-six fins and none of the fins have aspect ratios of more than ten to one.

Figure 3:
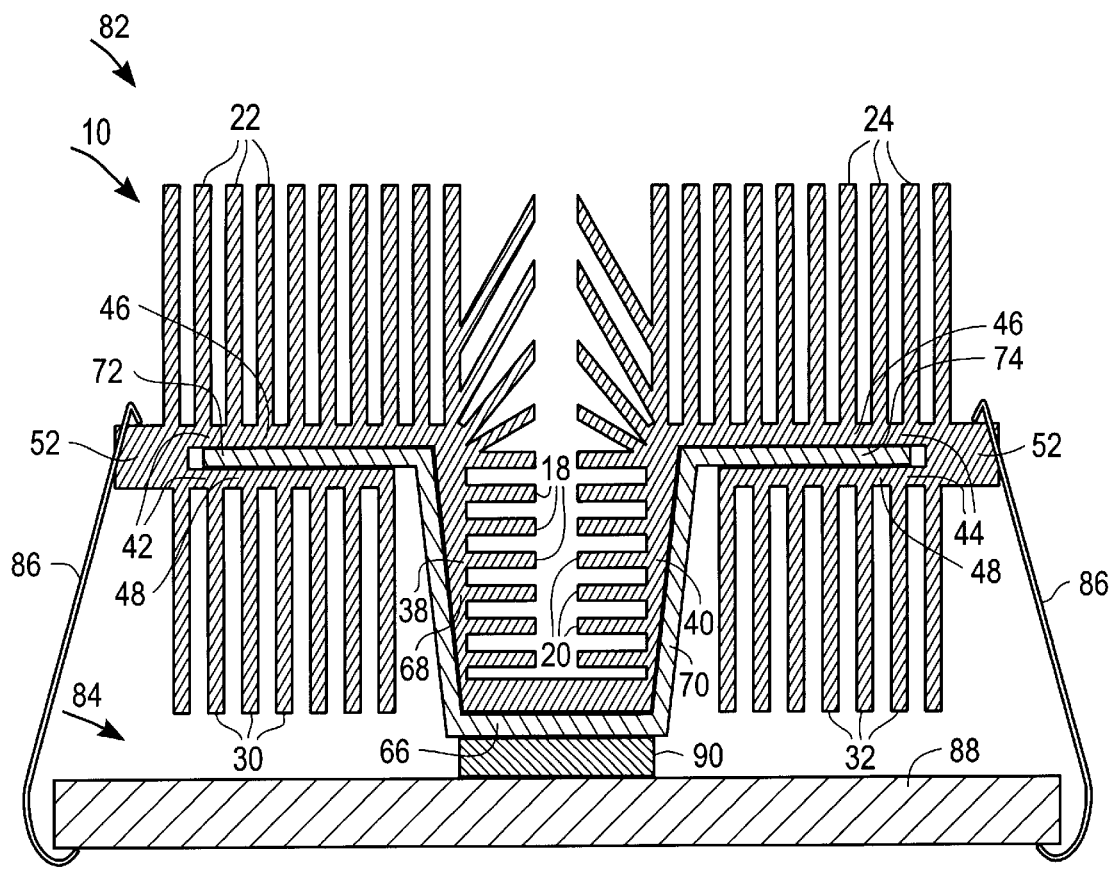
FIG. 3 is a cross-sectional end view of an assembly including an electronic device with the heat sink of FIG. 2 mounted thereto.

FIG. 3 illustrates an assembly 82 which includes an electronic device 84 and the heat sink 10 which is mounted to the electronic device 84 with clips 86.

The electronic device 84 includes a substrate 88 and a component 90 mounted on the substrate 88. The substrate 88 may, for example be a printed circuit board, and the component 90 may be a semiconductor package including a semiconductor die. The semiconductor die may be electrically accessed through the printed circuit board and may, for example, be a processor which generates a substantial amount of heat.

The heat sink 10 is located over the component 90 with the lower surface of the horizontal section 66 contacting an upper surface of the component 90. The clips 86 hook onto the substrate 88 and rest on the retaining formations 52 thereby mounting the heat sink 10 to the electronic device 84.

Heat generated by the component 90 is transferred through the lower surface of the horizontal section 66 to the horizontal section 66, causing a fluid within the horizontal section 66 to evaporate (form a vapor). The vapor flows from the horizontal section 66 up the vertical sections 68 and 70 to the sections 72 and 74.

Heat is transferred from the vertical section 68 to the vertical portion 38 from where the heat is conducted to the fins 18 and convected away from the fins 18. Heat is also transferred from the section 72 to the upper and lower halves 46 and 48 of the upper horizontal portion 42, from where the heat conducts to the fins 22 and 30 and is convected away from the fins 22 and 30. Heat is also transferred from the vertical section 70 to the vertical portion 40 from where the heat is conducted to the fins 20 and convected away from the fins 20. Heat is also transferred from the section 74 to the upper and lower halves 46 and 48 of the upper horizontal portion 44, from where the heat conducts to the fins 24 and 32 and is convected away from the fins 24 and 32.

When heat is transferred from the heat pipe at the sections 68, 70, 72, and 74, the vapor condenses (form condensed fluid) on an inner surface of the sections and the condensed fluid then flows back to the horizontal section 66.

It can thus be seen that the upper horizontal portions 42 and 44 can be used for efficiently transferring heat away from the component 90. A substantial amount of heat can be efficiently transferred by the upper horizontal portions 42 and 44 regardless of the fact that the upper horizontal portions 42 and 44 are located by a relatively large distance from the component 90 as required to provide space for the fins 30 and 32 between the substrate 88 and the upper horizontal portions 42 and 44.

Figure 4:
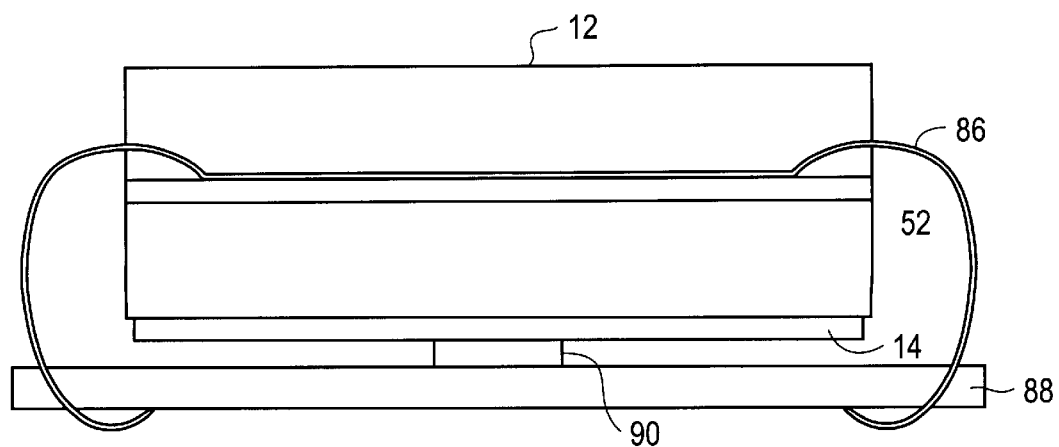
FIG. 4 is a side view of the assembly of FIG. 3.

As can be seen in FIG. 4, the component 90 is located only against a portion of the width of the heat pipe 14. The heat pipe 14 spreads the heat over the width of the member 12, thus allowing for the member 12 and its fins to be wider.

A highly efficient heat sink 10 is provided which is mounted over the component 90. A primary reason why the heat sink 10 is so efficient is because of the use of the flat heat pipe 14. One study has shown that the heat pipe 14, when constructed of copper, is thirty-four times as efficient in transferring heat when compared to a solid, heat conducting copper structure having similar dimensions. The heat pipe 14 changes direction at a number of locations 64 which allows for transferring of heat to required locations remote from the component 90. That makes it possible to construct the member 12 to have fins located remotely from the component 90 and to adapt the placement and direction of the fins to increase surface area within a relatively small overall volume. Also of importance is that all the fins are less than 25 mm in length which makes them more efficient in transferring heat away.

Because of the increased efficiency of the heat sink 10 the need for a fan located on the heat sink 10 is generally dispensed with. Electrical wiring to a fan is thus not required and a quieter overall system is provided.

Figure 5:
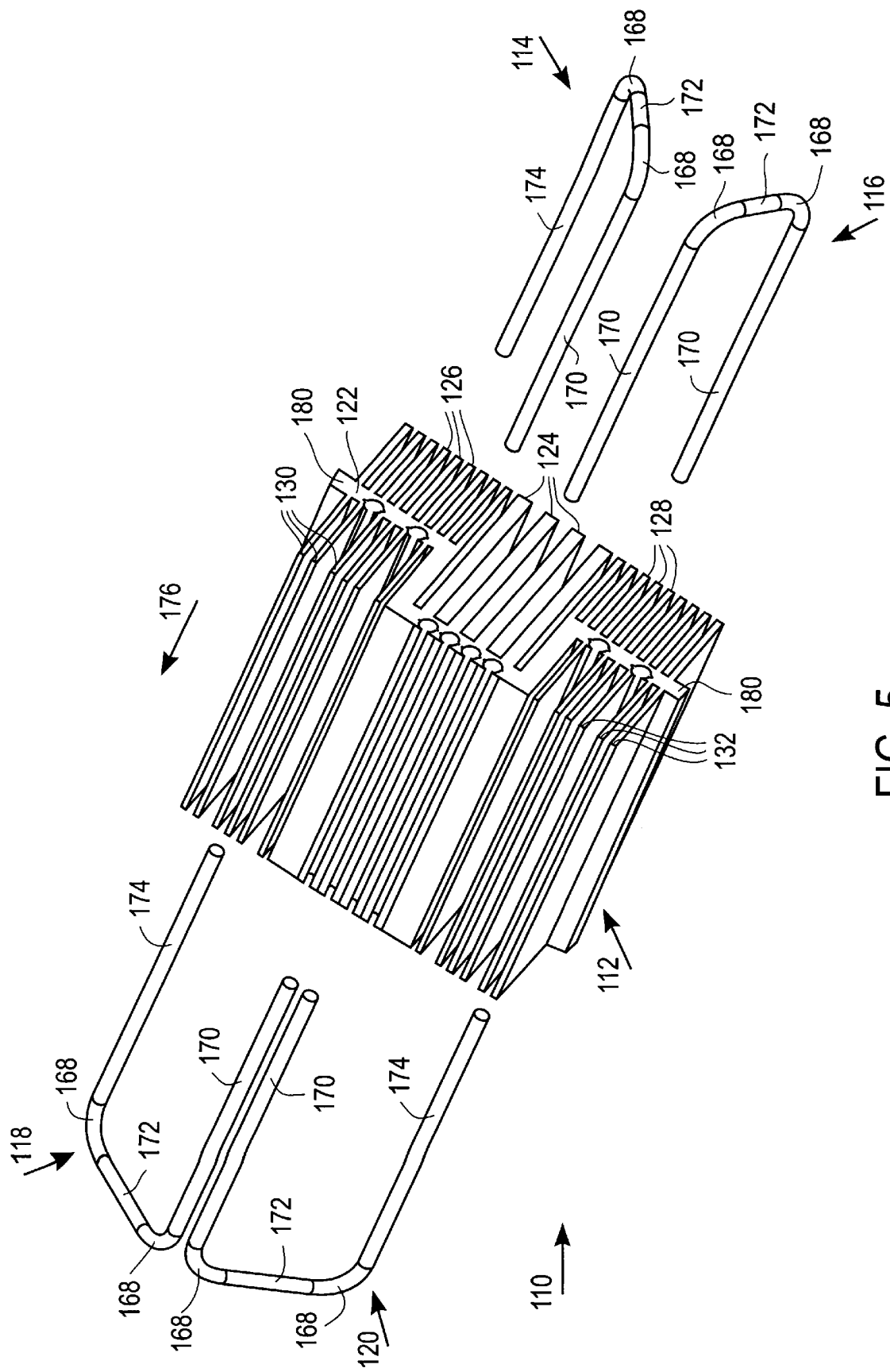
FIG. 5 is a perspective view of a heat sink, according to another embodiment of the invention and before final assembly, which includes a finned member and round heat pipes.

FIG. 5 of the accompanying drawings illustrates a heat sink 110 according to another embodiment of the invention. The heat sink 110 is shown before final assembly and includes a finned member 112 and four round heat pipes 114, 116, 118, and 120.

The member 112 includes a thermally conductive heat plate 122, and respective sets of fins 124, 126, 128, 130, and 132 on the heat plate 122. The member 112 is typically made of a metal such as aluminum and is typically formed in an extrusion process.

Figure 6:
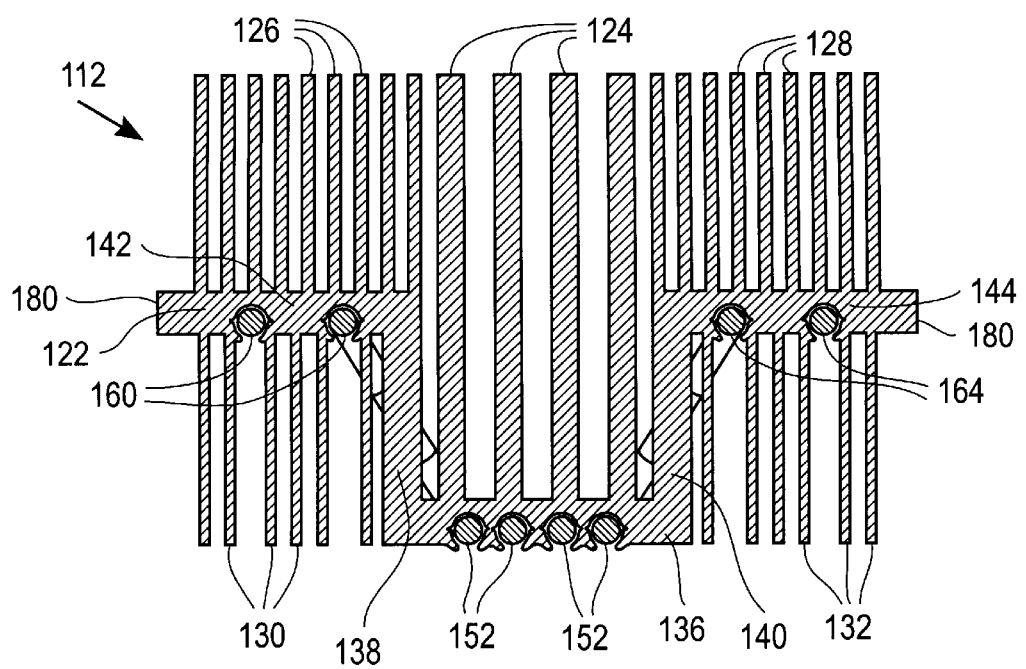
FIG. 6 is a cross-sectional end view of the heat sink of FIG. 5 before the heat pipes are secured to the member.

Referring to FIG. 6, the heat plate 122 firstly includes a portion 136 located in a lower horizontal plane. Another portion 138 of the heat plate 122 extends vertically upwardly from an edge of the lower horizontal portion 136, and a further portion 140 extends vertically upwardly from an opposing edge of the lower horizontal portion 136. Yet a further portion 142 of the heat plate 122 extends from an upper edge of the vertical portion 138 in a direction horizontally away from the lower horizontal portion 136. A portion 144 of the heat plate 122 also extends from an upper edge of the vertical portion 140 horizontally away from the lower horizontal portion 136. The horizontal portions 142 and 144 are located in a horizontal plane which is located above the substantially parallel to the horizontal plane in which the lower horizontal portion 136 is located.

The fins 124 are located on the lower horizontal portion 136 and extend vertically upwardly from the lower horizontal portion 136. Each one of the fins 124 has an aspect ratio of about ten to one and a length of about 50 mm.

The fins 126 are located on the upper horizontal portion 142 and extend vertically upwardly therefrom. The fins 128 are located on the upper horizontal portion 144 and extend vertically upwardly therefrom. The fins 130 are located on the upper horizontal portion 142 and extend vertically downwardly therefrom. The fins 132 are located on the upper horizontal portion 144 and extend vertically downwardly therefrom. Each one of the fins 126, 128, 130, and 132 has an aspect ratio of about ten to one and a length of about 22 mm.

Four openings 152 are formed in the lower horizontal portion 136. Two openings 160 are formed in the upper horizontal portion 142. Two openings 164 are formed in the upper horizontal portion 144.

FIG. 6 shows the member 112 in an x-y plane. Because the member 112 is made in an extrusion process, all the components thereof and openings formed therein extend substantially parallel to one another in a z-direction.

Referring again to FIG. 5, each heat pipe 114, 116, 118, or 120 changes direction at a number of locations 168. Each heat pipe 114, 116, 118, or 120 thereby has one, evaporator section 170, another section 172 extending transversely to the section 170, and another, condenser section 174 extending transversely to the section 172 and substantially parallel to the section 170.

The heat pipes 114 and 116 are located on one side of the member 112 with their sections 170 and 174 extending in a z-direction 176. The heat pipes 118 and 120 are located on an opposing side of the member 112 with their sections 170 and 174 extending in a direction opposing z-direction 176. The respective sections 170 and 174 are then inserted into the respective openings in the heat plate 122. Each section 170 is inserted into a respective opening 160 in the upper horizontal portion 142. The sections 174 of the heat pipe 116 and the heat pipe 120 are inserted into a respective opening 164 in the upper horizontal portion 144.

Figure 7:
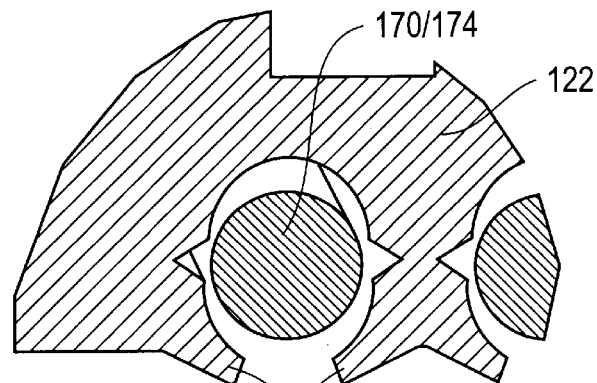
FIG. 7 is a cross-sectional view illustrating a portion of FIG. 6.
Figure 8:
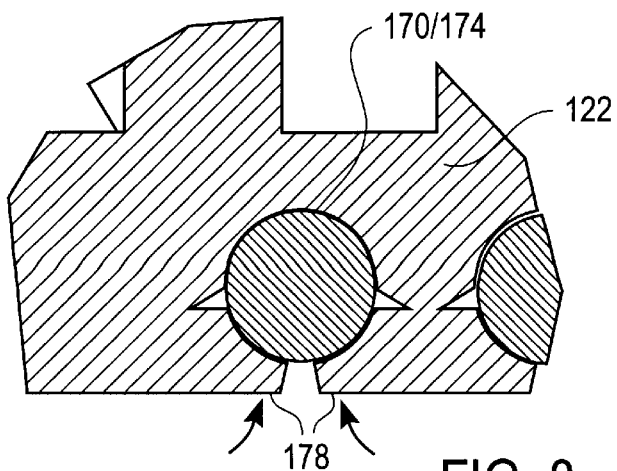
FIG. 8 is a view similar to FIG. 7 after the heat pipes are secured to the member.

FIG. 7 illustrates a portion of the heat plate 122 in the region of one of the openings 152, 160, or 164 with one of the sections 170 or 174 loosely inserted into the opening. The opening is open towards the bottom of the heat plate 122 and tabs 178 project from a lower surface of the heat plate 122 and tabs 178 project from a lower surface of the heat plate 122 on opposing sides of the opening. As shown in FIG. 8, the tabs 178 are bent towards the section 170 or 174 so that the section 170 or 174 is squeezed into engagement with a surface of the opening. An interface between the section 170 or 174 and a surface of the opening is preferably at least a transition fit or, more preferably, an interference fit.

Figure 9:
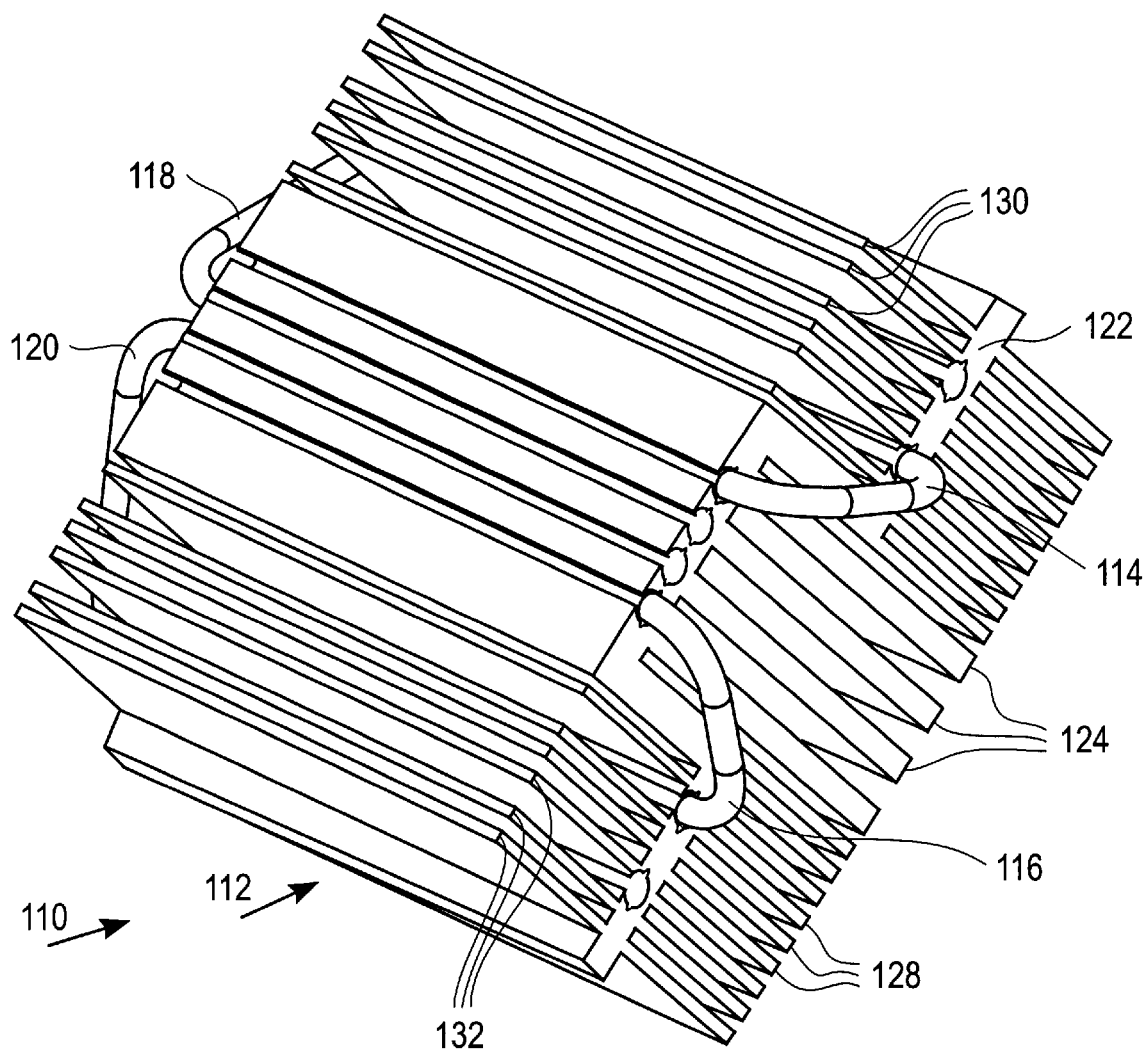
FIG. 9 is a perspective view of the heat sink of FIG. 5 after final assembly.

The heat pipes 114, 116, 118, and 120 are so secured to the member 12. FIG. 9 illustrates the heat sink 110 fully assembled. The heat sink 110 is located over a component of an electronic device and secured to a substrate of the electronic device by engaging with retaining structures 180 thereof in a manner similar to the manner illustrated in FIG. 3. A lower surface of the lower horizontal portion 136 is located against a heat generating component of the electronic device so that the sections 170 of the heat pipes 114, 116, 118, and 120 are located at the component.

Heat can then be transferred from the component directly to the sections 170, or to the lower horizontal portion 136 and from the lower horizontal portion 136 to the sections 170. A fluid within the sections 170 is evaporated by the heat (forms of vapor). The vapor flows from the sections 170 to the sections 172 and 174.

Heat is transferred from the sections 174 to the upper horizontal portions 142 and 144 from where the heat is conducted to the fins 126, 128, 130, and 132 and convected away from the fins. When the heat is transferred from the sections 174, the vapor condenses (forms condensed fluid) on an inner surface of the sections 174 and the condensed fluid then flows back to the sections 170.

More of the heat conducts from the sections 170 and the lower horizontal portion 136 to the fins 124 and is convected away from the fins 124.

The sections 170 also spread the heat in z-direction over the member 112. Symmetrical spreading of heat is provided for because two of the heat pipes 114 and 116 are located around a front of the member 112, and two of the heat pipes 118 and 120 are located around a back of the member 112.

As with the embodiment of FIG. 1, the heat pipes 114, 116, 118, and 120 change direction at a number of locations 168 which allows for transferring of heat to required locations. That makes it possible to construct the member 112 to have fins located remotely from a component which is cooled. A highly efficient heat sink is thereby provided within a small space located over the component. Other features and advantages of the heat sink 110 are the same as for the heat sink 10.

Figure 10:
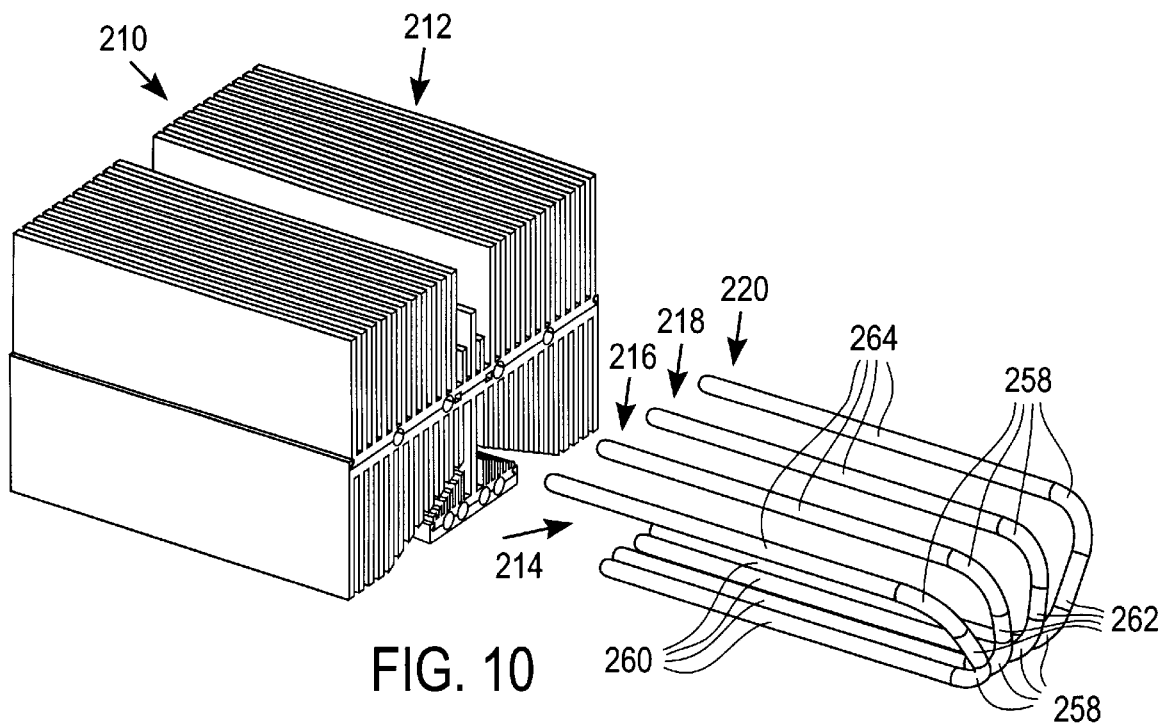
FIG. 10 is a perspective view of a heat sink according to a further embodiment of the invention and before final assembly.

FIG. 10 of the accompanying drawings illustrates a heat sink 210 according to another embodiment of the invention. The heat sink 210 is shown before final assembly and includes a finned member 212 and four round heat pipes 214, 216, 218, and 220.

Figure 11:
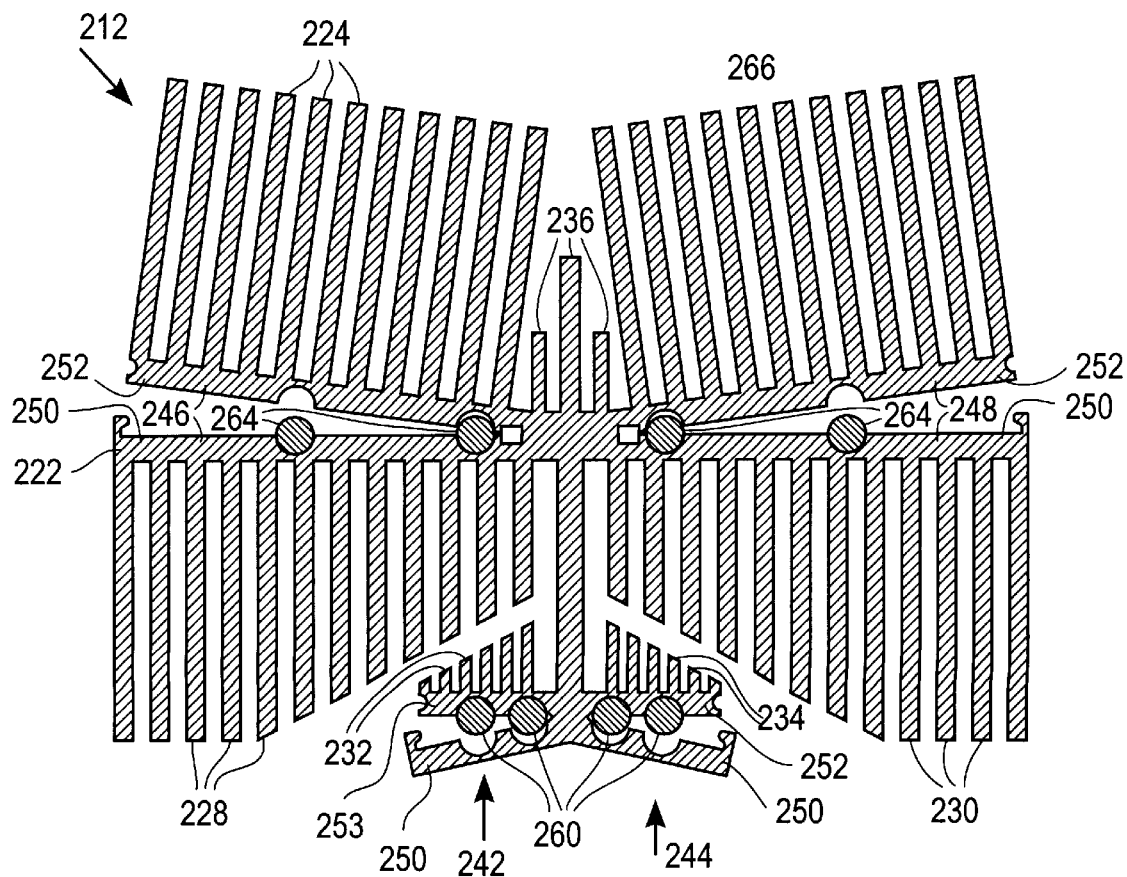
FIG. 11 is a cross-sectional end view of the heat sink of FIG. 10 before heat pipes thereof are secured to a finned member thereof.

Referring to FIG. 11, the member 212 includes a thermally conductive heat plate 222 in the form of an extruded "I", and respective sets of fins 224, 226, 228, 230, 232, 234, and 236 on the heat plate 222. The member 212 is typically made of a metal such as aluminum and is typically formed in an extrusion process.

The heat plate 222 firstly includes a vertical portion 240. Another portion 242 of the heat plate 222 extends substantially horizontally to one side from a lower end of the vertical portion 240, and another portion 244 of the heat plate 222 extends substantially horizontally to an opposing side from the lower end of the vertical portion 240. A further portion 246 of the heat plate 222 extends substantially horizontally to one side from an upper edge of the vertical portion 240, and a further portion 248 off the heat plate 222 extends substantially horizontally to an opposing side from the upper edge of the vertical portion 240.

Each one of the portions 242, 244, 246, and 248 is splayed longitudinally so as to include a respective lower half 250 and a respective upper half 252. The lower halves 250 of the lower portions 242 and 244 can hinge relative to the upper halves 252 thereof because of deformation of the member 212 near the vertical portion 240. The upper halves 252 of the upper portions 246 and 248 can hinge relative to the lower halves 250 thereof because of deformation of the member 212 near the vertical portion 240.

The fins 224 are located on the upper half 252 of the upper portion 246 and extend substantially at right angles upwardly therefrom. The fins 226 are located on the upper half 252 of the upper portion 248 and extend substantially at right angles upwardly therefrom. The fins 228 are located on the lower half 250 of the upper portion 246 and extend substantially vertically downwardly therefrom. The fins 230 are located on the lower half 250 of the upper portion 248 and extend substantially vertically downwardly therefrom. The fins 232 are located on the upper half 252 of the lower portion 242 and extend substantially vertically upwardly therefrom. Inner ones of the fins 228 are shorter than outer ones of the fins 228 so that space is provided for the fins 232.

The fins 234 are located on the upper half 252 of the lower portion 244 and extend substantially vertically upwardly therefrom. Inner ones of the fins 230 are shorter than outer ones of the fins 230 so that space is provided for the fins 234. The fins 236 are located on the upper portions 246 and 248 between the fins 224 and 226.

Referring again to FIG. 10, each heat pipe 214, 216, 218, or 220 changes direction at a number of locations 258. Each heat pipe 214, 216, 218, or 220 thereby includes an evaporator section 260, another section 262 extending transversely to the section 260, and another, condenser section 264 extending transversely to the section 262 and substantially parallel to the section 260.

Figure 12:
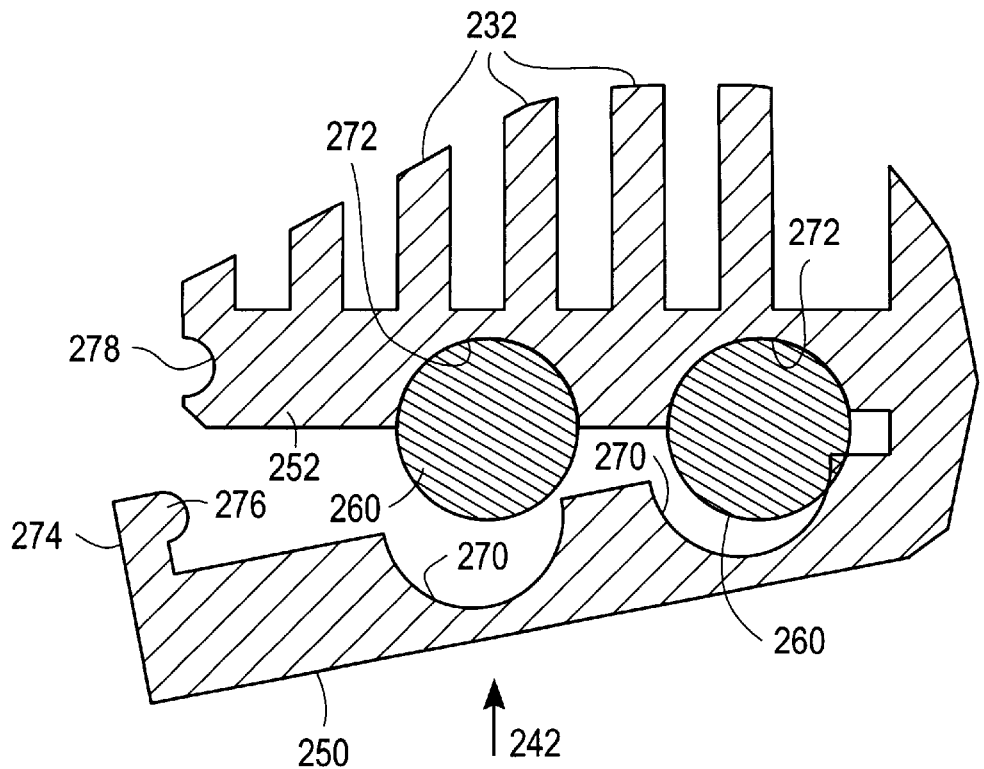
FIG. 12 is a cross-sectional end view showing a portion of FIG. 11.

FIG. 12 illustrates the heat sink in an area of the lower portion 242 and the fins 232. Two grooves 270 are formed in the lower half 250 during extrusion. Two grooves 272 are also formed in the upper half 252 during extrusion. A component 274 extends upwardly from the lower half 250 and has a notch 276 on a surface thereof. A recess 278 is formed in an end of the upper half 252. A respective section 260 of a respective heat pipe is inserted in each groove 272.

Figure 13:
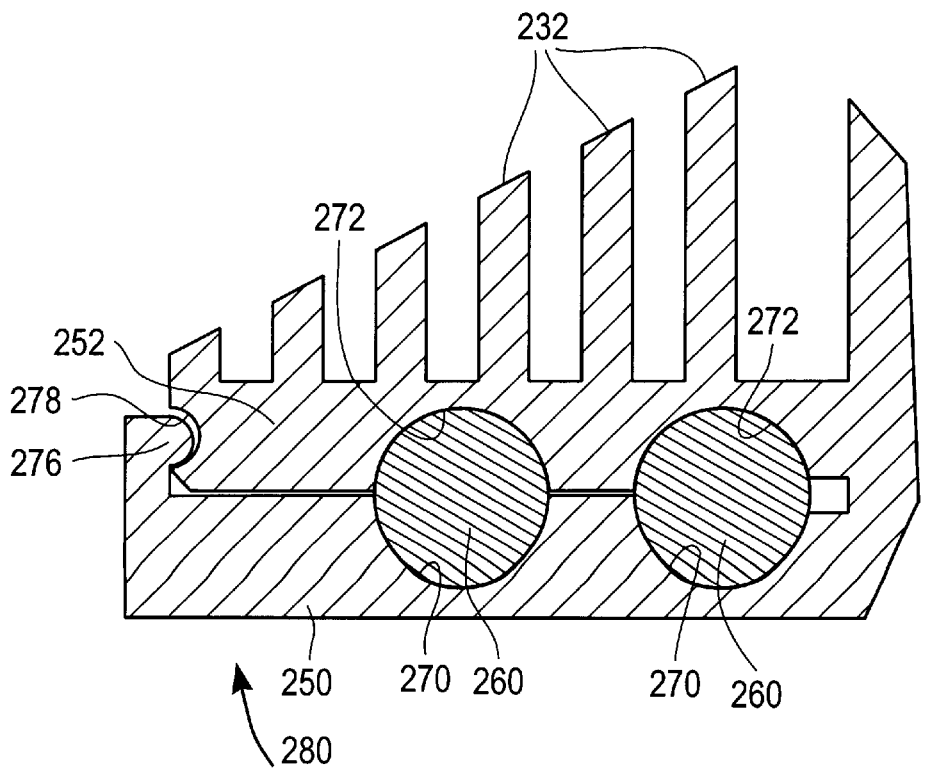
FIG. 13 is a view similar to FIG. 12 after the heat pipes are secured to the member.

As illustrated in FIG. 13, the lower half 250 is then hinged towards the upper half 252 in a direction 280. The notch 276 snaps into the recess 278. The lower half 250 is thereby retained in position relative to the upper half 252. The sections 260 of the heat pipes are squeezed between the upper and lower halves 250 and 252 within the grooves 270 and 272 with, preferably, at least a transition fit and, more preferably, and interference fit.

Referring again to FIG. 11, the lower portion 244 has a similar construction to the lower portion 242 and the sections 260 of the other two heat pipes are located within the lower portion 244 in a similar manner. The sections 264 of the heat pipes are located within the grooves within the upper portions 246 and 248 in a similar manner. Notches on the lower halves 250 engage with recesses on the upper halves 252 of the upper portions 246 and 248 to retain the upper halves 252 of the upper portions 246 and 248 in position relative to the lower halves 250.

Figure 14:
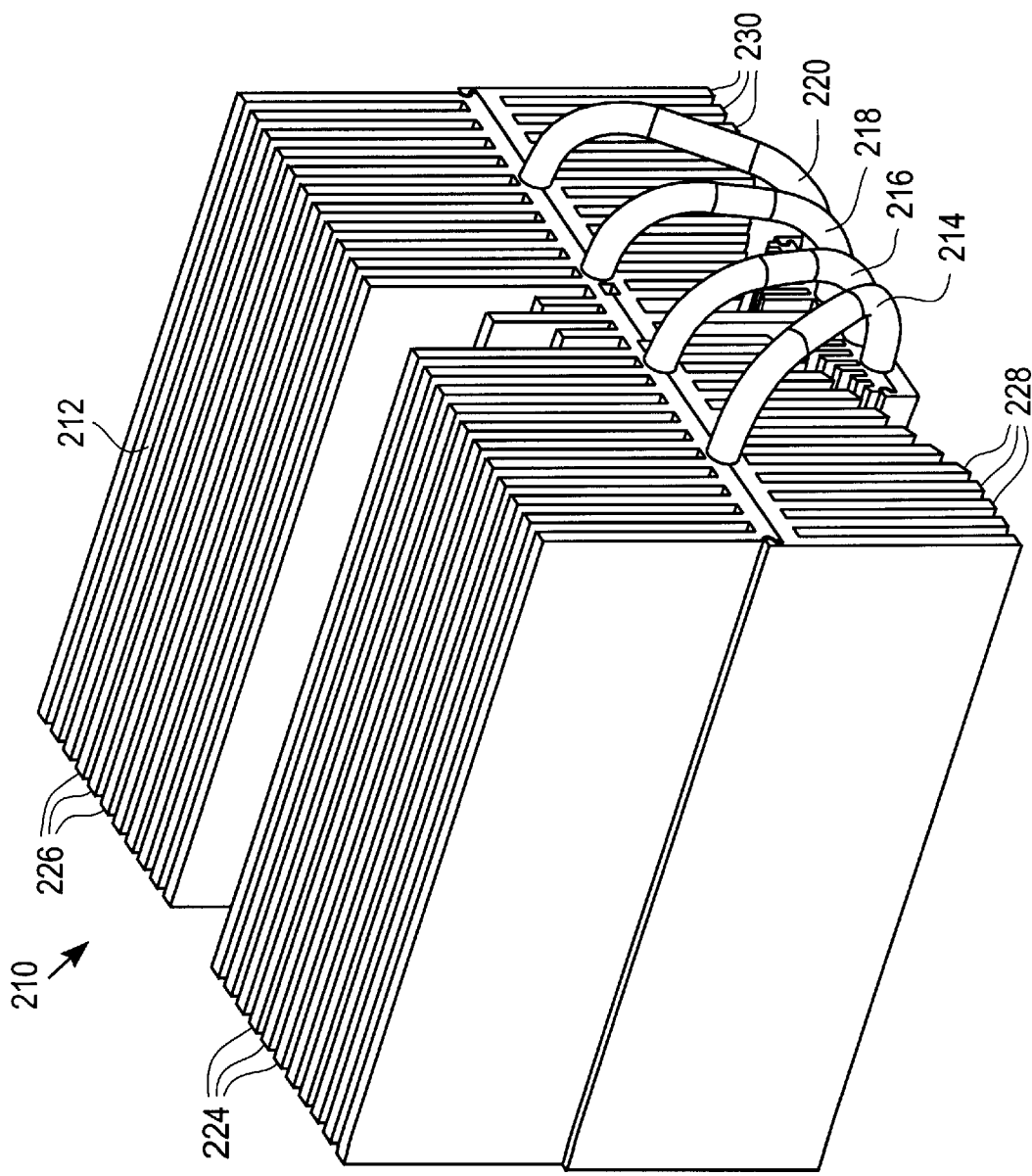
FIG. 14 is a perspective view of the heat sink of FIG. 10 after final assembly.

The heat pipes 214, 216, 218, and 220 are thereby secured to the member 212 as illustrated in FIG. 14. The heat sink 210 is located over a heat generating component of an electronic device and secured to a substrate of the electronic device by engaging clips with retaining structures (not shown) thereof in a manner similar to the manner illustrated in FIG. 3. Lower surfaces of the lower portions 242 and 244 are located against the heat generating component of the electronic device so that the sections 260 of the heat pipes 214, 216, 218, and 220 are located at the component.

Heat can then be transferred from the component to the lower portions 242 and 244 and from the lower portions 242 and 244 to the sections 260. A fluid within the sections 260 is evaporated by the heat (forms a vapor). The vapor flows from the sections 260 to the sections 262 and 264.

Heat is transferred from the sections 264 to the upper portions 246 and 248 from where the heat is conducted to the fins 224, 226, 228, and 230. When the heat is transferred from the sections 264, the vapor condenses (forms condensed fluid) on an inner surface of the sections 264 and the condensed fluid then flows back to the sections 260.

More of the heat conducts from the lower portions 242 and 244 to the fins 232 and 234 and is convected away from the fins 232 and 234.

As with the previous embodiments, the heat pipes 214, 216, 218, and 220 change direction at a number of locations which allows for transferring of heat to required locations remote from the component. Other features and advantages of the heat sink 210 are the same as for the heat sinks previously described.

It should be noted that the invention is not limited to the use of heat pipes that change direction at distinct locations as in all the embodiments hereinbefore described. It may, for example, the possible to provide a heat sink with a heat pipe having respective sections following on one another on a continuous curve. Because of the curve, the heat pipe would have changed direction between one of the sections when compared to another one of the sections.

While certain exemplary embodiments have been described and shown in the accompanying drawings, it is to be understood that such embodiments are merely illustrative and not restrictive of the current invention, and that this invention is not restricted to the specific constructions and arrangements shown and described, since modifications may occur to those ordinarily skilled in the art.

What is claimed:

1. A heat sink for cooling an electronic device, which includes:
   a member having a first portion, a second portion and a plurality of fins on the second portion and the fins extending in at least two different directions from the second portion; and
   a heat pipe secured to the member, the heat pipe having a first, evaporator section at the first portion so that heat can be transferred thereto from a heat generating component of the electronic device, and a second, condenser section at the second portion so that heat can be transferred therefrom to the second portion, the heat pipe changing direction at least once between the first section and the second section.

2. A heat sink according to claim 1 wherein the first portion is a first heat plate portion in a first plane, and the second portion is a second heat plate portion in a second plane which is different to the first plane.

3. A heat sink according to claim 2 wherein the first and second heat plate portions are substantially parallel to one another.

4. A heat sink according to claim 1 wherein the member has a third portion and a plurality of fins on the third portion and the heat pipe includes a third section between the first and second sections, the third section being located at the third portion so that heat can be transferred therefrom to the third portion, wherein the heat pipe changes direction at least once between the first and third portions, and at least once more between the third and second portions.

5. A heat sink according to claim 1 wherein the second portion is a heat plate portion and the fins are located in one set on one side of the heat plate portion, and in another set on an opposing side of the heat plate portion.

6. A heat sink according to claim 1 wherein the first section has one surface, through which heat can be transferred thereto from the electronic device, which is exposed, and an opposing surface against the first portion.

7. A heat sink according to claim 1 wherein the second section is located within the second portion.

8. A heat sink according to claim 7 wherein an interface between the second portion and the second section is at least a transition fit.

9. A heat sink according to claim 1 wherein the heat pipe is a flat heat pipe.

10. A heat sink according to claim 9 wherein the heat pipe has a thickness, a length which changes direction, the length and the thickness being in an x-y plane, and a width in a z-direction.

11. A heat sink according to claim 1 wherein each fin has a length and a thickness, the length being less than fifteen times the thickness.

12. A heat sink according to claim 11 wherein the member is made of aluminum.

13. A heat sink according to claim 1 wherein the member includes a third portion, and a plurality of fins on the third portion, and the heat pipe includes a third section on a side of the first section opposing the second section, the third section being at the third portion so that heat can be transferred therefrom to the third portion, the heat pipe changing direction at least once between the first section and the third section.

14. A heat sink according to claim 13 wherein the second and third portions are heat plate portions located in substantially the same plane.

15. A heat sink according to claim 14 wherein the fins on the second portion are located in one set on one side of the second portion and in another set on an opposing side of the second portion, and the fins on the third portion are located in one set on one side of the third portion and in another set on an opposing side of the third portion.

16. A heat sink for cooling an electronic device, which includes:
    a member having a first plate portion in a first plane, a second plate portion in a second plane which is different to the first plane, and a plurality of fins on the second plate portion and the fins extending in at least two different directions from the second portion; and
    a heat pipe secured to the member, the heat pipe having a first, evaporator section against the first plate portion so that heat can be transferred thereto from a heat generating component of the electronic device, and a second, condenser section against the second plate portion so that heat can be transferred therefrom to the second plate portion, the heat pipe changing direction at least once between the first section and the second section.

17. An assembly which includes:
    an electronic device having a heat generating component;
    a member mounted to the electronic device over the components, the member having a first portion and a second portion located distant from the component, and a plurality of fins on the second portion the fins and extending in at least two different directions from the second portion; and
    a heat pipe secured to the member, the heat pipe having a first, evaporator section at the component so that heat can be transferred from the component to the first section, and a second condenser section at the second portion so that heat can be transferred from the second section to the insert portion, the heat pipe changing direction at least once between the first section and the second section.

* * * * *